United States Patent
Könnemann

(10) Patent No.: US 7,022,587 B2
(45) Date of Patent: Apr. 4, 2006

(54) METHOD FOR PRODUCING CHIPS FROM WAFERS OF LOW THICKNESS

(76) Inventor: Beatriz Könnemann, Habichtweg 3, D-63814 Mainaschaff (DE)

( * ) Notice: Subject to any disclaimer, the term of this patent is extended or adjusted under 35 U.S.C. 154(b) by 85 days.

(21) Appl. No.: 10/359,549

(22) Filed: Feb. 5, 2003

(65) Prior Publication Data
US 2004/0152285 A1  Aug. 5, 2004

(51) Int. Cl.
*H01L 21/301* (2006.01)
(52) U.S. Cl. .................. 438/462; 438/460; 438/464; 438/33
(58) Field of Classification Search ........ 438/460–466, 438/33
See application file for complete search history.

(56) References Cited
U.S. PATENT DOCUMENTS
6,638,865 B1 * 10/2003 Tanaka ...................... 438/692

\* cited by examiner

Primary Examiner—Dung A. Le
(74) Attorney, Agent, or Firm—Edwin D. Schindler

(57) ABSTRACT

A method for producing chips from a wafer of low thickness, in which the wafer has an active side on which integrated circuits are arranged in a grid with interspaces and a metallized backside facing away from the active side, the method preferably includes the steps of: coating the active side of the wafer with a protective coating; covering the active side with a mask having light-transmitting lines disposed along the interspaces between the integrated circuits, the mask being otherwise non-light transmitting, exposing the light-transmitting lines to light for producing exposed lines; etching away the exposed lines; producing trenches having depth from the exposed lines; removing the protective coating on the active side of the wafer, applying a carrier on the active side of the wafer; grinding the metallized backside of the wafer; removing the metallized backside by way of etching to a wafer thickness of about 20 microns greater than the depth of the trenches; removing the metallized backside to a base of the trenches; and, releasing the chips from the carrier.

33 Claims, 1 Drawing Sheet

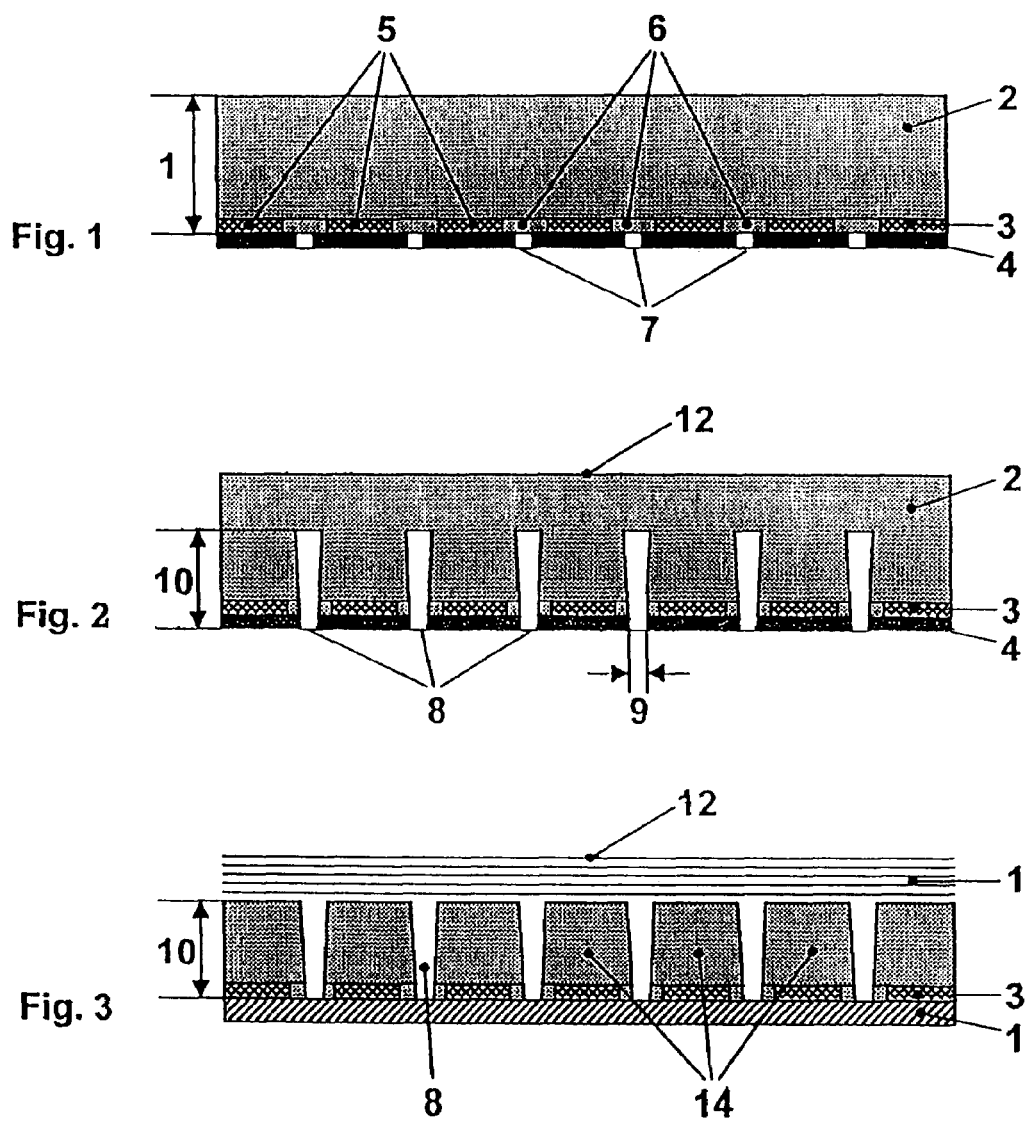

METHOD FOR PRODUCING CHIPS FROM WAFERS OF LOW THICKNESS

TECHNICAL FIELD OF THE INVENTION

The invention relates to a method for producing chips from wafers of low thickness by the application of combined thinning and polishing machines, the wafers having in each case a coated, active side, on which integrated circuits are arranged in a grid with interspaces between them, and an uncoated or metallised backside facing away from the active side. The object of the invention is also a wafer produced according to the proposed method.

DESCRIPTION OF THE PRIOR ART

The production of electronic chips starts from wafers. By this is understood thin slices of semi-conductor crystals on one surface of which microscopically fine circuits are applied in a grid-like arrangement—often by means of electron-optical lithographic methods. The individual circuits are separated from one another by means of interspaces, along which the semiconductor slices are separated up. The individualized circuits with the substrate comprising semicon-ductor crystals in each case represent a chip.

To separate the wafers, various methods are used in the prior art. It is in particular known to use a method in which the wafers are first sawn along the interspaces between the integrated circuits and then the wafer material is removed from the backside of the wafer by means of grinding and polishing machines. However, it has been found that this procedure has the disadvantage that the grooves become filled up and blocked with swarf or polishing waste. Because of irregular breaking apart, there is a high reject rate.

To avoid this disadvantage, a method with reversed sequence of the individual steps is also used in practice. In this method, the grooves of the wafer are only produced on the front side thereof after conclusion of the grinding and polishing. The result of this procedure, however, is that released material particles are deposited on the active side and can thereby lead disadvantageously to disturbances of function of the applied circuits and to secondary processing. In the case of thin wafers, the separation operation takes several hours; the edges also break off easily.

The grinding of the wafer backside itself is also fraught with problems in the method according to the prior art. Because of the non-uniform grain size of the grinding medium, grooves of different depth are produced in the surface, which lead to a stress in the processed surface. The disadvantageous consequence of this is a curvature of the wafers, which is greater, the thinner the wafer is. Since, as a result of the curvature, the circuits applied on the active side can be destroyed. The mechanical removal of wafer material by means of grinding is subject to limitations. Wafers produced according to the prior art are therefore hardly less than a thickness of about 200 μm.

Against this background, the invention has set itself the object of providing a method for the production of wafers/chips, whose thickness is considerably below the values that can be achieved with methods according to the prior art. By means of the proposed process, it is nevertheless ensured that the handling of wafers/chips of low thickness can be carried out easily and reliably.

This object is achieved according to the invention by a method with the following process operations:

a) Coating of the active sides of wafers with a protective layer, in particular a photosensitive lacquer, preferably in a layer thickness of 3 to 50 μm,
b) Covering the active side with a mask, which has light-transmitting lines, preferably with a width of about 5–100 μm along the interspaces between the integrated circuits,
c) Exposure of the lines, preferably with UV light,
d) Etching away the exposed lines, preferably by means of isotropic dry etching using 02 with a very short etching duration,
e) Producing trenches by isotropic deep etching of the lines to a depth of preferably about 10–150 μm,
f) Removing the photosensitive lacquer on the active side,
g) Applying a carrier as a foil or substrate on the active side,
h) Grinding away the backside of the wafer with the aforementioned thinning or thinning-polishing machine, preferably to a wafer thickness of about 100–150 μm,
i) Removing the backside by etching, preferably by means of wet etching, to a wafer thickness that is about 20 μm greater than the thickness of the trenches,
j) Removing the backside to the base of the trenches, preferably by means of isotropic dry etching, and
k) Removing the chips from the carrier film, preferably in pick-and-place machines by means of flip-chip technologies.

With the proposed method, based on the prior art, grinding and additionally polishing operations are also proposed, however the operations which precede and succeed these operations differ fundamentally from those of known methods.

In the method according to the present invention, the first step comprises applying a photosensitive lacquer or another protective coating on the active side of the wafer in a coating thickness of several microns (μm). Then, lines of about 5 to 100 μm width are exposed through a correspondingly formed mask between the individual integrated circuits. The exposed photosensitive material can be removed by the use of etching techniques, isotropic dry etching with the use of $O_2$ and an etching duration of about 15 s being recommended for this operation. The lines exposed down to the semiconductor crystal slice are subsequently subjected to dry etching, also known as die etching, trenches being produced, which usually increase in size somewhat towards the base of the trench. The duration of the etching process is set such that the trenches achieve a depth of about 10–150 μm. After completion of this operation, on the active side of the wafer, the photosensitive lacquer covering the circuits is completely removed, and instead a carrier in the form of a film or substrate, with or without tensioning frame, is applied over the active surface. In the subsequent operations, the backside of the wafers is processed. The wafer material is first removed by means of thinning machines. With this grinding process, the thickness of the wafer is reduced from an initial value of about 700–750 μm to an intermediate value of about 100/150 μm. At the aforementioned intermediate value, the smallest thickness of the wafer achievable by grinding is reached. According to a significant concept of the invention, etching processes are provided for further reduction of the wafer thickness. It is proposed to carry out the further removal of wafer material firstly by wet etching. The wafer thickness achieved hereby is approximately 20 μm greater than the depth of the trenches. After cleaning, the wafer is finally removed on its backside by means of isotropic dry etching to a thickness that corresponds to the depth of the trenches.

According to a central idea of the invention, all operations for processing the wafer, through to dividing up of the wafer into individual chips, are carried out such that the wafer or the chips are not subject to any stresses. To achieve this aim, the grinding operation is terminated at a wafer thickness of about 100/150 µm, and the wafer material is removed by etching in the subsequent operation. In particular, in the last etching operation, the wafer falls apart virtually of its own accord into the individual chips without the application of mechanical forces. This excludes the risk of destruction of the microscopically fine structures on the chip by mechanical stresses. After the dividing up of the wafer, the individual chips remain on the carrier film that covers the active side of the wafer. This provides for further simple handling or transportation of the chips. The further processing of the wafer is preferably carried out in the devices known as "pick-and-place" machines by means of the so-called flip-chip technology.

As a result, the proposed method allows the production of extremely thin wafers/chips: with a thickness of about 30 to 50 µm, the wafers/chips produced by the method according to the invention thus have a thickness that is considerably below the values achievable in methods of the prior art. This ensures at the same time that the extremely thin wafers/chips according to the present invention are easy to handle. The shape of the chips is immaterial here and may be an angular, but also circular or oval geometry.

In the further processing of the wafers, or the chips, it has proved appropriate—according to a feature of the invention—to use suction lifters to remove the individual chips or all chips from the wafer. The suction lifters are placed on the backside of the wafer and allow the chip to be released from the carrier film with very low force application. In parallel, or alternatively, thereto, pressure plungers can act from the front side of the wafers on the film. The release can be supported by the temperature of the film or, when perforated carrier films are used, by the application of solvents.

Further developments of the invention provide for variants in the sequence of the individual process operations.

BRIEF DESCRIPTION OF THE DRAWING FIGURES

Further details, features and advantages of the invention can be taken from the following part of the description. In this part, a wafer according to the invention is explained in detail with reference to a drawing. The individual drawings show a schematic view of a wafer after execution of the various processing operations, in which:

FIG. 1 shows a cross-section through a wafer after application and exposure of the photosensitive lacquer on the active side;

FIG. 2 shows a cross-section through a wafer after etching of the trenches between the individual integrated circuits; and, FIG. 3 shows a cross-section through a wafer after removal of the wafer material from the backside down to the depth of the trenches.

DETAILED DESCRIPTION OF THE DRAWINGS AND PREFERRED EMBODIMENTS

FIG. 1 shows a wafer 1 in an early processing stage. It includes of a carrier plate 2 of semiconductor crystals and an active layer 3, on which a layer of photosensitive lacquer 4 is applied. Within the active layer, integrated circuits 5 are arranged in the form of a grid, between which, in each case, interspaces 6, without activity, are formed. The layer of photosensitive lacquer has been exposed through a mask (not shown). In this case, corresponding to the structure of this mask 6, lines 7 of approx. 10 µm width have been exposed in the region between the interspaces.

For the operation shown in FIG. 2, the exposed photosensitive material has been removed by the application of etching techniques, and thereby the carrier material 2 of the wafer 1 has been exposed in the region of the lines 7, while the other regions of the active wafer side remain protected by the photosensitive lacquer 4. In the etching methods subsequently carried out, the wafer material 2 has therefore only been removed at the exposed places, with the result that trenches 8 have formed at these places. In the present embodiment, the width 9 of the trenches is about 10 µm and the depth 10 about 50 µm. After conclusion of this process, the photosensitive lacquer 4 on the active side of the wafer has been completely removed and, instead, the active surface has been covered with a carrier film.

The carrier film is indicated in FIG. 3 with the reference mark 11. In the operation on which this figure is based, the wafer material was removed from the backside 12, first by means of thinning machines (not shown) and then by etching. This material removal is intended to be indicated by the symbolically represented layer thicknesses 13. The thickness of the wafer in this process was reduced from initially 700 to 750 µm to a value corresponding to the depth 10 of the trenches 8. When this value is reached, the wafer falls apart virtually by itself to form the individual chips 14 without the application of mechanical forces. The risk of destruction of the microscopically fine structure on the chip within the active layer by mechanical stresses is thereby eliminated. Surface stresses do not occur.

The carrier film 11 has the function, after separation of the carrier plate 2, of maintaining the chips 14 is a state that is simple to handle for further processing. The film 11 correspondingly ensures that, after separation of the carrier plate, the individual chips remain on the film. In addition, the film also provides protection of the active layer 3 against mechanical damage during transportation of the wafer. For further processing of the chips 14, they are removed from the carrier film 11 by means of suitable apparatus.

In a frequently used variant of the method according to the present invention, it is provided that operations i)–k) during the production of the wafer are not carried out at first. In this case the wafers leave the production premises as semi-finished products. The achieved production status here is close to the final state, also the wafer thickness is still about 150 µm, so that the wafers can be dispatched with low risk. The final completion of the wafer is then carried out by the receiver by removing the wafer backside by means of etching down to a wafer thickness that corresponds to the depth of the trenches. Furthermore, according to the invention it is proposed that operation e)—production of trenches by deep-etching the lines—be carried out by means of high-speed dry etching. The etching rates obtainable here are in the range up to about 15–50 µm/min. At a trench depth of 50 µm, this means that the operation for producing all trenches between the individual integrated circuits can be carried out within a few minutes. In comparison to all known methods for producing trenches, considerable savings in process time can thereby be obtained. For example, a 100–300 µm thin wafer can be divided up within minutes instead of hours.

In a preferred further development of the operation, a further step, in which the backside of the wafer is polished, is provided between the operations h) and i), that is to say after completion of grinding. The reason for this operation lies in the fact that grinding, because of the grain size of the grinding material, leaves grooves on the surface, and these grooves are not compensated even during etching. To obtain a groove-free and therefore a stress-free backside, it is therefore advisable to interpose a polishing operation before carrying out the etching processes. This makes possible breakage-safe handling during dispatch and transport.

Another variant of the proposed method relates to the etching methods provided after the grinding, or after the grinding and polishing. Departing from the proposed sequence, it is also possible to replace the wet-etching process and the subsequent dry-etching process by one process step. In this case, the thickness of the wafer is reduced, in one operation by means of dry etching, from about 150 µm initially to a thickness that corresponds to the depth of the trenches. The advantage of this method consists in the elimination of retooling work on the etching device and a corresponding saving in process time. The thickness uniformity of the chips is thereby ensured; the stress at the chip edges is etched away as well.

A particularly preferred further development of the method takes into account the heating during grinding, polishing and etching. This variant is characterised in that, instead of the operation g), the modified step g').

Application of a carrier (11) in the form of a perforated film or a perforated substrate is provided, and during operation h) and/or i) and/or j), helium is injected through the holes of the perforation. The helium enters the trenches produced by etching and migrates through the complete wafer. With this process the heat generated by the wafer during grinding and etching is transferred to the helium and carried away by this to the outside. The sensitive structures of the active side and the, if appropriate, heat-sensitive film are in this manner effectively protected against damage by overheating.

Another variant is aimed at minimising the risk of fracture of the wafer after removal of the backside wafer material. As practical tests have shown, after completed removal of the backside of the wafer razor-sharp edges remain at its edges. For the monocrystalline wafer, these edges represent a high risk for the initiation of fractures or fracture lines. In general, only a slight shock to the wafer is then sufficient to cause it to fracture. A variant of the proposed method contributes to this risk in that the outer edges of the wafer are rounded by means of appropriate process steps. According to a feature of the invention it is correspondingly provided that operation a) or b) or c) or d) is preceded by the following steps:

removal of the wafer material lying outside the grid of integrated circuits towards the grid to a distance of preferably about 300 µm from the edge of the grid, the lateral surfaces extending over the thickness of the wafer in each case form an angle of preferably 85–90 degrees with the surface of the wafer on the active side, rounding or chamfering of the edges formed by said lateral surfaces and said surface of the wafer.

It is recommended to carry out the removal and/or rounding and/or chamfering of the edges by means of the aforesaid thinning or polishing machines or by means of laser radiation. In the case of machining with the aid of laser light, the surfaces generated by removal show a certain surface damage, which however is harmless in character and can be smoothed again by subsequent dry etching.

In a variant of the last-mentioned method, it is proposed that the angle between the lateral surfaces of the wafer and the surface of the wafer on its active side is 90 degrees. This embodiment can advantageously be utilised for laminating a plurality of wafers one on top of the other to form a stack, and the removal of the wafer material for all wafers of the stack simultaneously.

Alternatively to the described method for rounding of edges by means of additional process steps, the invention also provides for an advantageous solution with modified process steps. In this case, instead of operation b), a modified operation b) is used:

Covering of the active side (3) with a mask,
which, along the interspaces (6) between the integrated circuits (5)
and around the integrated circuits lying on the outer edge of the grid has light-transmitting lines preferably with a width of about 5–100 µm
and is otherwise non-light-transmitting.

The operations subsequent to this remain unchanged. Together with the preceding operation they lead, for the integrated circuits lying at the outer edge of the grid, to trenches also being produced by etching on the side facing the wafer edge. These circuits are thus, like the circuits lying in the central region of the grid, being surrounded on all sides by etched trenches. As has been found in practice, those edges of the wafer lying at the trench start are sufficiently round to eliminate a risk of the chips fracturing after their completion.

The invention also comprises a wafer produced according to the proposed method. This is characterised in that it has trenches produced by etching along the interspaces between the integrated circuites, with width of the trenches preferably being about 5/100 µm and the depth of the trenches preferably being about 20–150 µm. The wafer according to the invention additionally has a carrier film on the active side, which protects the active side against mechanical damage during transportation of the wafer and additionally increases the stability of the wafer, so that it can also be dispatched without risk.

In a further development of the wafer according to the present invention, the backside of the wafer is removed down to the base of the trench by the application of at least one etching process. In this state, the wafer has reached its ultimate machining state and falls apart virtually by itself into individual chips. The carrier film applied to the active side, ensures here that the chips continue to remain in their places, but also can be removed from the carrier film in a simple manner with the aid of appropriate apparatus.

In the embodiment of the carrier film, numerous variants are possible. Depending on which further processing steps the wafer or the chips are subject to, the carrier film can be designed either so as to be either rigid or elastic, and in addition can have a continuous surface or be perforated. Perforated films are widely used in practice, since they assist the release of the chips from the carrier film in a simple manner. In this embodiment, a solvent is applied to the carrier film to release the chips, whicn penetrates through the perforation into the space between the film and the chip surface, and thus contributes itself to the release.

What is claimed is:

1. A method for producing chips from a wafer of low thickness, said wafer having an active side on which integrated circuits are arranged in a grid with interspaces and a metallized backside facing away from said active side, said method comprising the steps of:

coating the active side of said wafer with a protective coating;

covering the active side with a mask having light-transmitting lines disposed along said interspaces between the integrated circuits, said mask being otherwise non-light transmitting;

exposing said light-transmitting lines to light for producing exposed lines;

etching away said exposed lines;

producing trenches having depth from said exposed lines;

removing said protective coating on the active side of said wafer;

applying a carrier on the active side of said wafer;

grinding the metallized backside of said wafer;

removing the metallized backside via etching to a wafer thickness of about 20 microns greater than the depth of said trenches;

removing the metallized backside to a base of said trenches; and, releasing the chips from said carrier thereby producing chips of having a low thickness.

2. The method for producing chips from a wafer of low thickness according to claim 1, wherein said protective coating used for said step of coating the active side of said wafer is a photosensitive lacquer.

3. The method for producing chips from a wafer of low thickness according to claim 2, wherein said protective layer has a thickness of 3–50 microns.

4. The method for producing chips from a wafer of low thickness according to claim 1, wherein said light-transmitting lines have a width of about 5 to 100 microns.

5. The method for producing chips from a wafer of low thickness according to claim 1, wherein the light for carrying out said step of exposing said light-transmitting lines to light for producing exposed lines is ultraviolet light.

6. The method for producing chips from a wafer of low thickness according to claim 1, wherein said step of etching away said exposed lines is carried out via isotropic dry etching using $O_2$.

7. The method for producing chips from a wafer of low thickness according to claim 1, wherein said step of producing trenches is carried out via isotropic dry etching of said exposed lines with the depth of the trenches being approximately 10 to 150 microns.

8. The method for producing chips from a wafer of low thickness according to claim 1, wherein said carrier is a film.

9. The method for producing chips from a wafer of low thickness according to claim 1, wherein said carrier is elastic.

10. The method for producing chips from a wafer of low thickness according to claim 1, wherein said step of grinding the metallized backside of said wafer is performed until said wafer has a thickness of about 100 to 150 microns.

11. The method for producing chips from a wafer of low thickness according to claim 1, wherein said step of removing the metallized backside via etching is carried out by wet etching.

12. The method for producing chips from a wafer of low thickness according to claim 1, wherein said step of removing the metallized backside to the base of said trenches is carried out via isotropic dry etching.

13. The method for producing chips from a wafer of low thickness according to claim 1, wherein said step of releasing the chips from said carrier is carried is carried out via flip-chip technology.

14. The method for producing chips from a wafer of low thickness according to claim 1, wherein said step of releasing the chips from said carrier is carried out with suction lifters placed on the metallized backside of said wafer.

15. The method for producing chips from a wafer of low thickness according to claim 1, wherein said step of releasing the chips from said carrier is carried out with pressure plungers acting on the active side of said wafer.

16. The method for producing chips from a wafer of low thickness according to claim 1, wherein said step of producing trenches having depth from said exposed lines is carried out via high-speed etching.

17. The method for producing chips from a wafer of low thickness according to claim 1, wherein said high-speed etching is carried out at an etching rate of approximately 15 to 50 microns.

18. The method for producing chips from a wafer of low thickness according to claim 1, wherein said step of grinding the metallized backside of said wafer is carried out with a thinning apparatus.

19. The method for producing chips from a wafer of low thickness according to claim 1, further comprising the step of polishing the metallized backside of said wafer with a polishing apparatus subsequent to said step of grinding the metallized backside of said wafer.

20. The method for producing chips from a wafer of low thickness according to claim 1, wherein said carrier is a perforated film, and further comprising the step of blowing helium through holes of perforations in said perforated film.

21. The method for producing chips from a wafer of low thickness according to claim 1, wherein said carrier is a perforated substrate, and further comprising the step of blowing helium through holes of perforations in said perforated film.

22. The method for producing chips from a wafer of low thickness according to claim 1, further comprising the steps of:

removing wafer material lying outside said grid of said integrated circuits towards said grid at a distance of about 300 microns from an edge of said grid, with lateral surfaces extending over the thickness of said wafer in each case, after said step of removing wafer material, forming an angle of approximately 85°–90° with a surface of said wafer lying on said active side; and, rounding or chamfering of edges formed by said lateral surfaces and said surface of said wafer, said steps of removing wafer material and said rounding or chamfering occurring prior to said step of coating the active side of said wafer with said protective coating.

23. The method for producing chips from a wafer of low thickness according to claim 22, wherein said steps of removing wafer material and said rounding or chamfering is carried out by a grinding apparatus.

24. The method for producing chips from a wafer of low thickness according to claim 22, wherein said steps of removing wafer material and said rounding or chamfering is carried out by a polishing apparatus.

25. The method for producing chips from a wafer of low thickness according to claim 22, wherein said steps of removing wafer material and said rounding or chamfering is carried out by a laser.

26. The method for producing chips from a wafer of low thickness according to claim 22, wherein said angle is 90°, and further comprising the step of:

laminating a plurality of said wafers one on top of another for forming a stack and then performing said step of removing wafer material simultaneously for all wafers in said stack.

27. The method for producing chips from a wafer of low thickness according to claim 1, wherein said step of covering the active side with said mask further includes light-transmitting lines disposed around said integrated circuits lying on an outer edge of said grid.

28. The wafer of low thickness produced according to the method of claim 1.

29. The wafer of low thickness produced according to the method of claim 4.

30. The wafer of low thickness produced according to the method of claim 7.

31. The wafer of low thickness produced according to the method of claim 10.

32. The wafer of low thickness produced according to the method of claim 12.

33. The wafer of low thickness produced according to the method of claim 22.

* * * * *